(12) United States Patent
Vallauri et al.

(10) Patent No.: US 12,044,703 B2
(45) Date of Patent: Jul. 23, 2024

(54) CONTACT PROBE FOR HIGH-FREQUENCY APPLICATIONS WITH IMPROVED CURRENT CAPACITY

(71) Applicant: TECHNOPROBE S.P.A., Cernusco Lombardone (IT)

(72) Inventors: Raffaele Vallauri, Cernusco Lombardone (IT); Fabio Morgana, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 174 days.

(21) Appl. No.: 17/783,433

(22) PCT Filed: Dec. 10, 2020

(86) PCT No.: PCT/EP2020/085593
§ 371 (c)(1),
(2) Date: Jun. 8, 2022

(87) PCT Pub. No.: WO2021/122326
PCT Pub. Date: Jun. 24, 2021

(65) Prior Publication Data
US 2023/0028352 A1 Jan. 26, 2023

(30) Foreign Application Priority Data
Dec. 19, 2019 (IT) .......................... 102019000024889

(51) Int. Cl.
*G01R 1/067* (2006.01)
(52) U.S. Cl.
CPC ..... *G01R 1/06716* (2013.01); *G01R 1/06755* (2013.01)

(58) Field of Classification Search
CPC ............ G01R 1/06716; G01R 1/06755; G01R 1/06744; G01R 1/07357; G01R 1/06772; G01R 1/06733
(Continued)

(56) References Cited

U.S. PATENT DOCUMENTS 4,622,514 A * 11/1986 Lewis ................ G01R 1/07357
324/750.25
4,773,877 A * 9/1988 Kruger ............... H01R 13/2428
324/755.05
(Continued)

FOREIGN PATENT DOCUMENTS

WO 2016146476 A1 9/2016
WO 2016156002 A9 10/2016

OTHER PUBLICATIONS

International Search Report and Written Opinion for International Application No. PCT/EP2020/085593 (12 pages) (Feb. 23, 2021).

*Primary Examiner* — Christopher P McAndrew
(74) *Attorney, Agent, or Firm* — LUCAS & MERCANTI, LLP

(57) ABSTRACT

A contact probe having a first end portion and a second end portion, a probe body extended along a longitudinal development direction between the first end portion and the second end portion is disclosed. The probe body has a pair of arms separated by a slot and extending according to the longitudinal development direction and a conductive insert extended along the longitudinal development direction, in a bending plane of the contact probe. The conductive insert is made of a first material and the contact probe is made of a second material and the first material has a lower electrical resistivity than an electrical resistivity of the second material. The conductive insert is a power transmission element of the contact probe and the arms are structural support
(Continued)

elements of the contact probe during a deformation of the probe body.

14 Claims, 11 Drawing Sheets

(58) Field of Classification Search
USPC .................................................. 324/755.05
See application file for complete search history.

(56) References Cited

U.S. PATENT DOCUMENTS

| | | | | |
|---|---|---|---|---|
| 5,977,787 A * | 11/1999 | Das | ............... | G01R 1/07371 324/755.06 |
| 7,629,807 B2 * | 12/2009 | Hirakawa | ........... | G01R 1/06727 324/755.07 |
| 7,731,546 B2 * | 6/2010 | Grube | ............... | G01R 1/06716 439/700 |
| 2004/0005792 A1 * | 1/2004 | Sabatier | ............ | G01R 1/07357 439/66 |
| 2007/0216432 A1 * | 9/2007 | Kister | ................ | G01R 1/07378 324/754.11 |
| 2009/0002009 A1 * | 1/2009 | Brandorff | .......... | G01R 1/07357 324/750.16 |
| 2009/0280676 A1 * | 11/2009 | Weiland | ............ | H01R 13/2407 439/482 |
| 2010/0231249 A1 * | 9/2010 | Dang | .................. | G01R 1/0675 324/750.29 |
| 2011/0126775 A1 * | 6/2011 | Seltzer | ................... | A01K 1/033 119/500 |
| 2012/0286816 A1 | 11/2012 | Kister | | |
| 2013/0099813 A1 * | 4/2013 | Hoshino | ............ | G01R 1/06755 324/755.01 |
| 2015/0015287 A1 | 1/2015 | Debauche et al. | | |
| 2015/0015289 A1 * | 1/2015 | Eldridge | ............ | G01R 1/06733 324/754.03 |
| 2015/0280345 A1 | 10/2015 | Kimura et al. | | |
| 2017/0059612 A1 | 3/2017 | Crippa et al. | | |
| 2018/0024166 A1 * | 1/2018 | Acconcia | .......... | G01R 1/06755 324/750.25 |
| 2018/0288948 A1 * | 10/2018 | Croteau | ............ | A01G 27/003 |

* cited by examiner

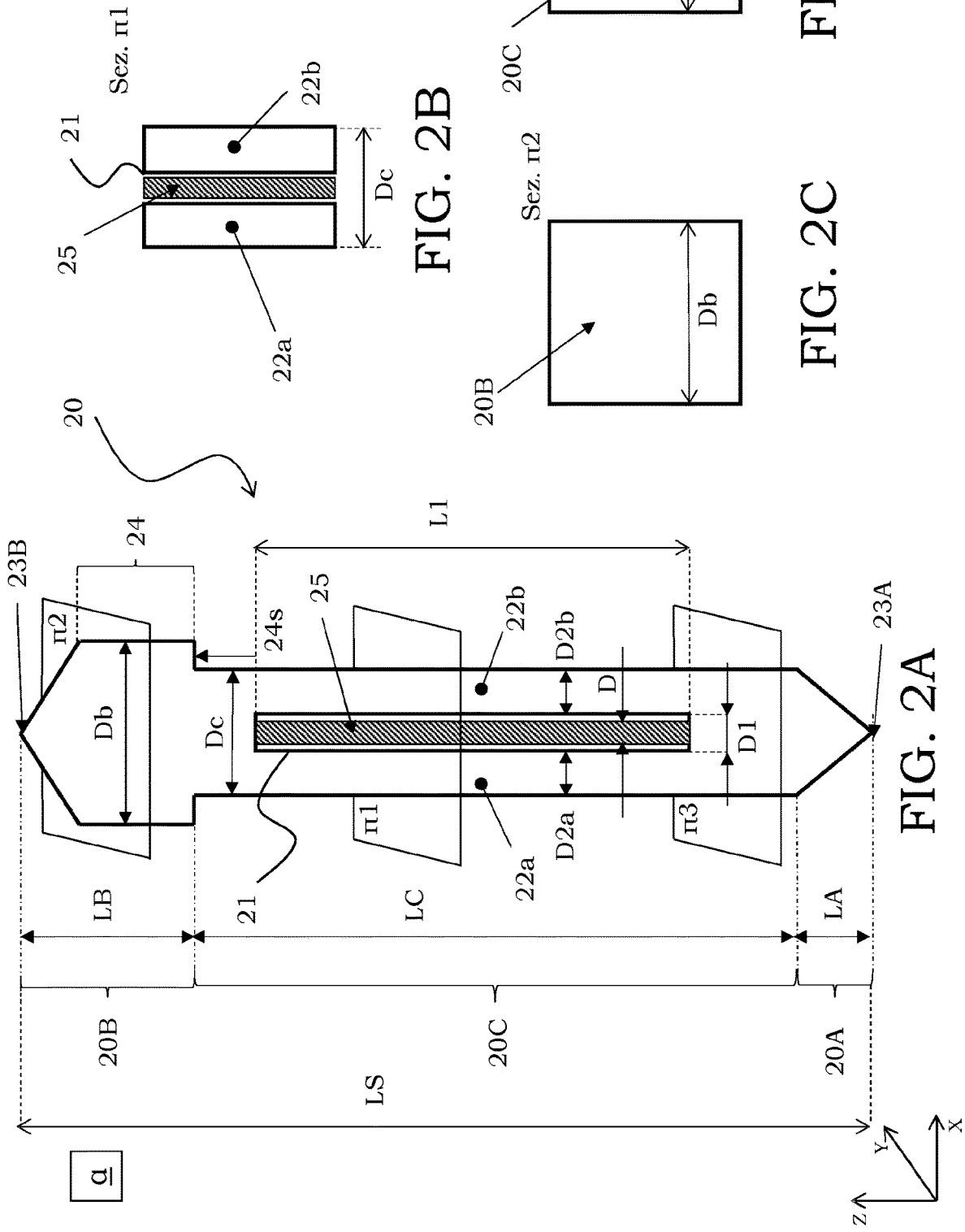

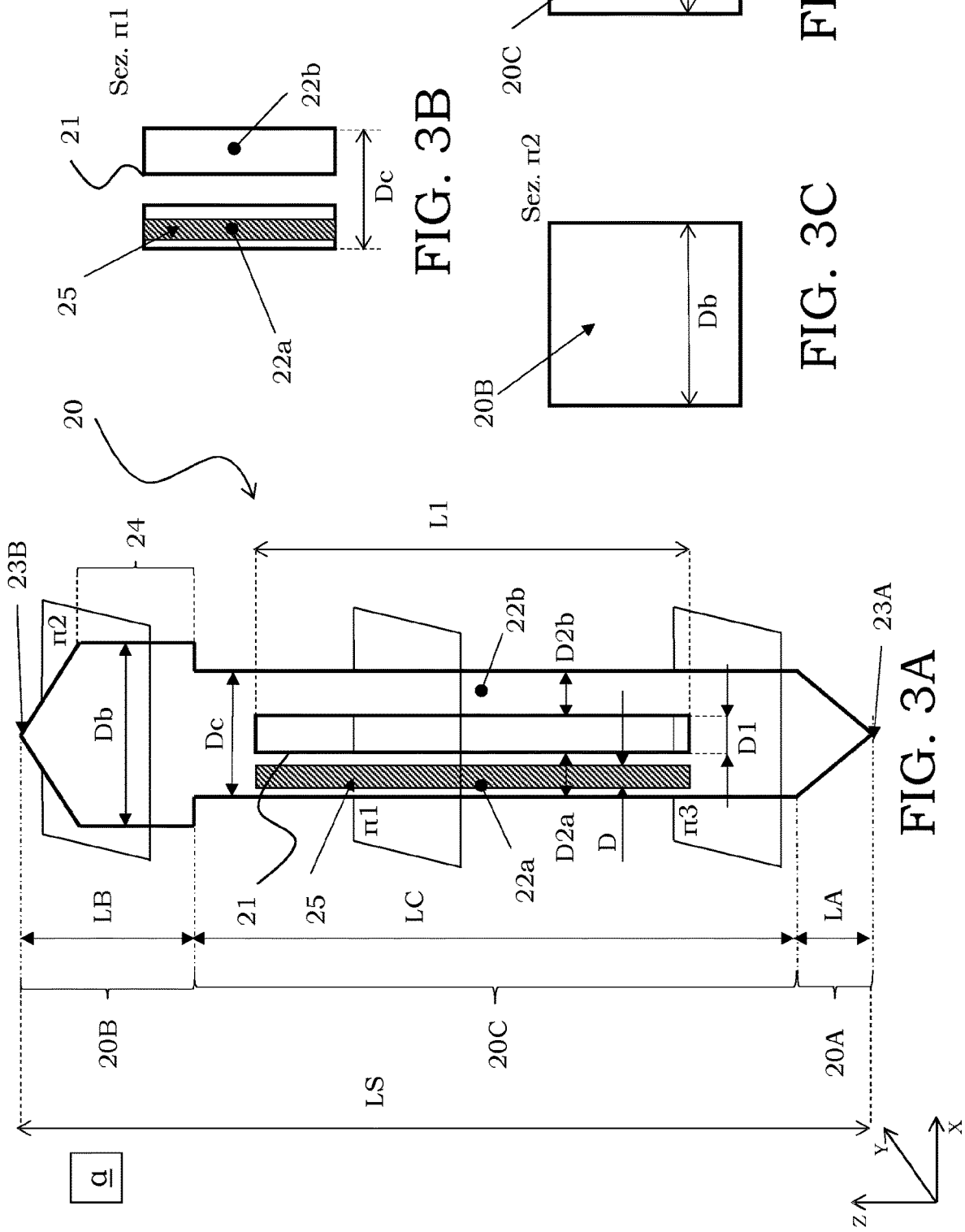

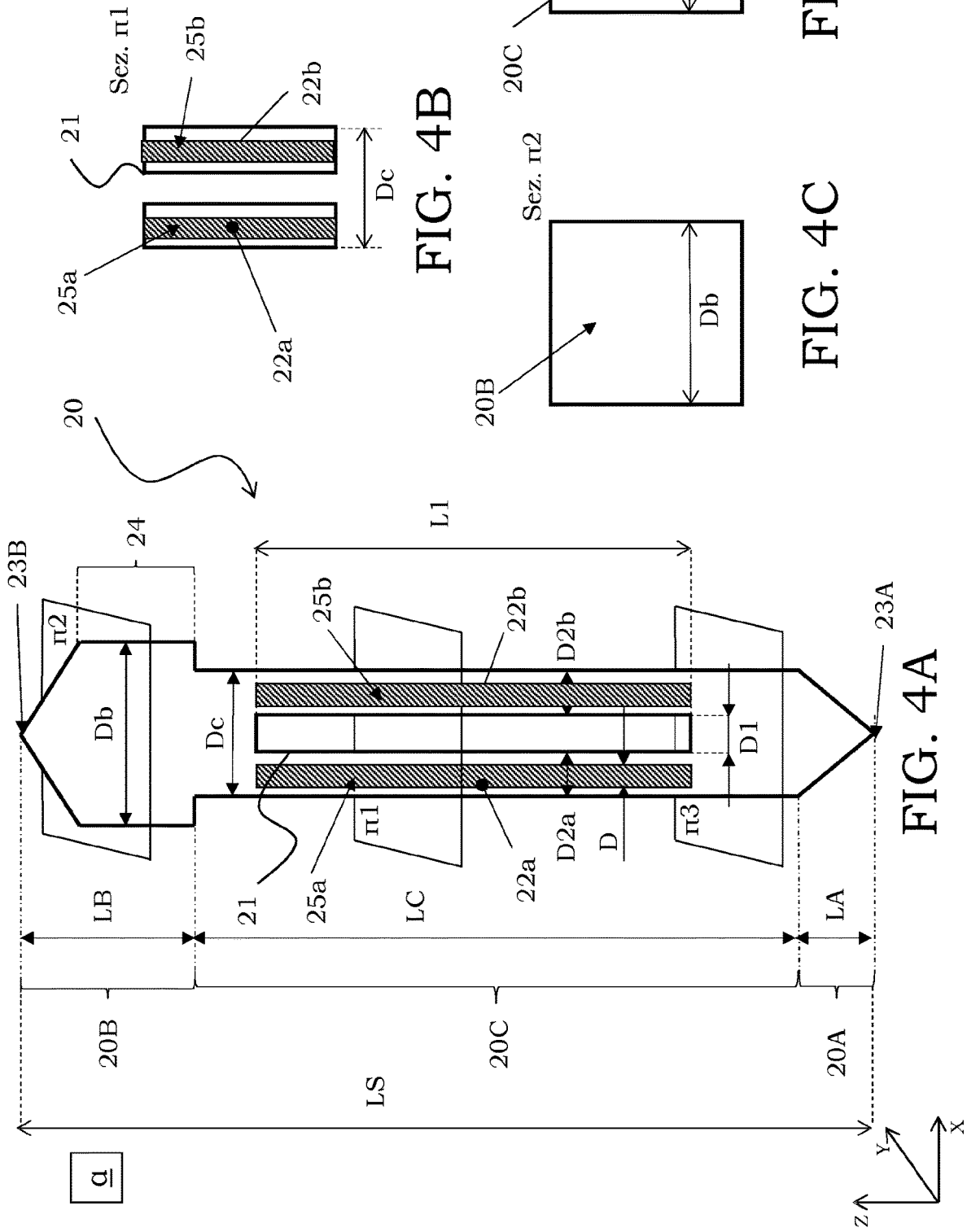

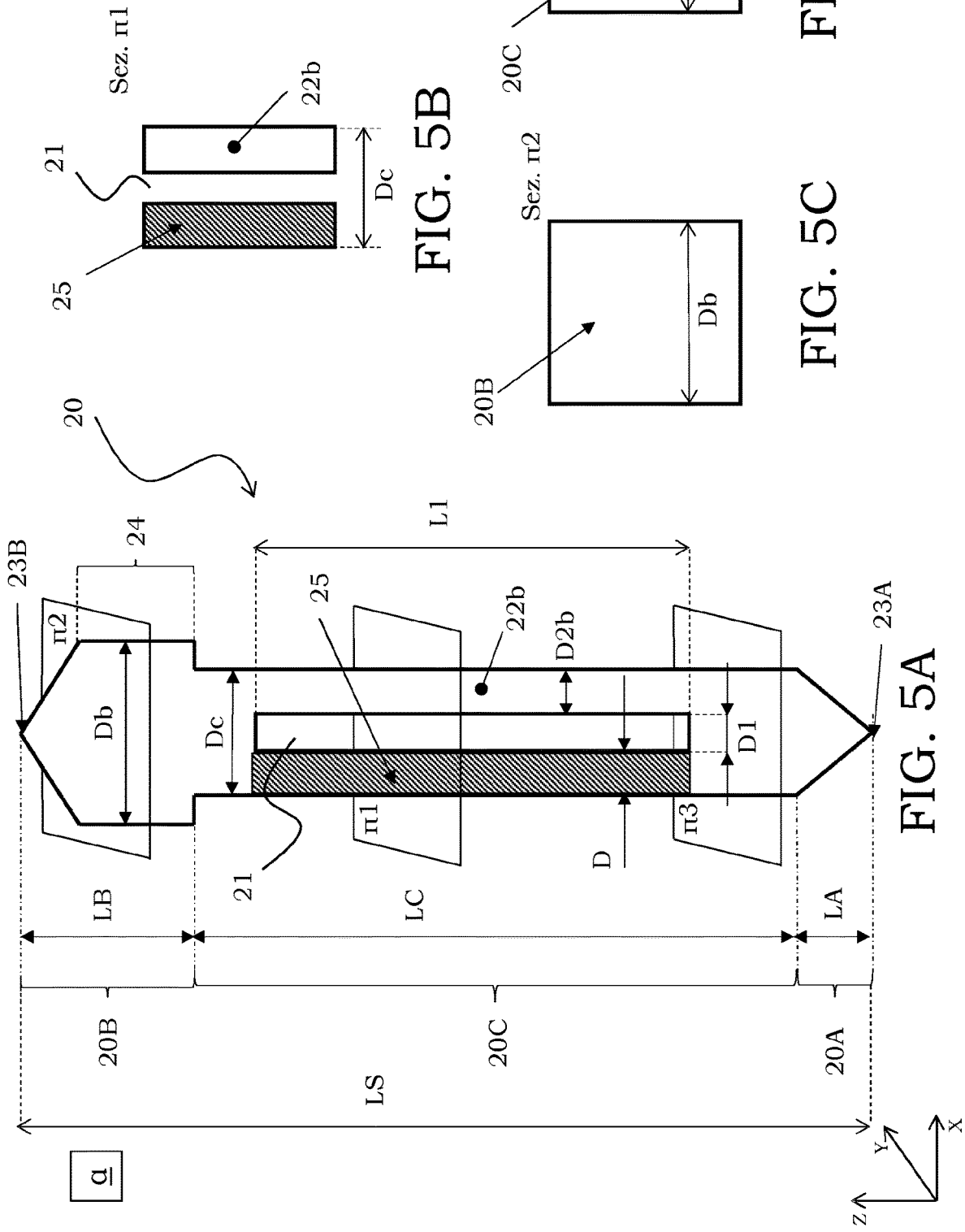

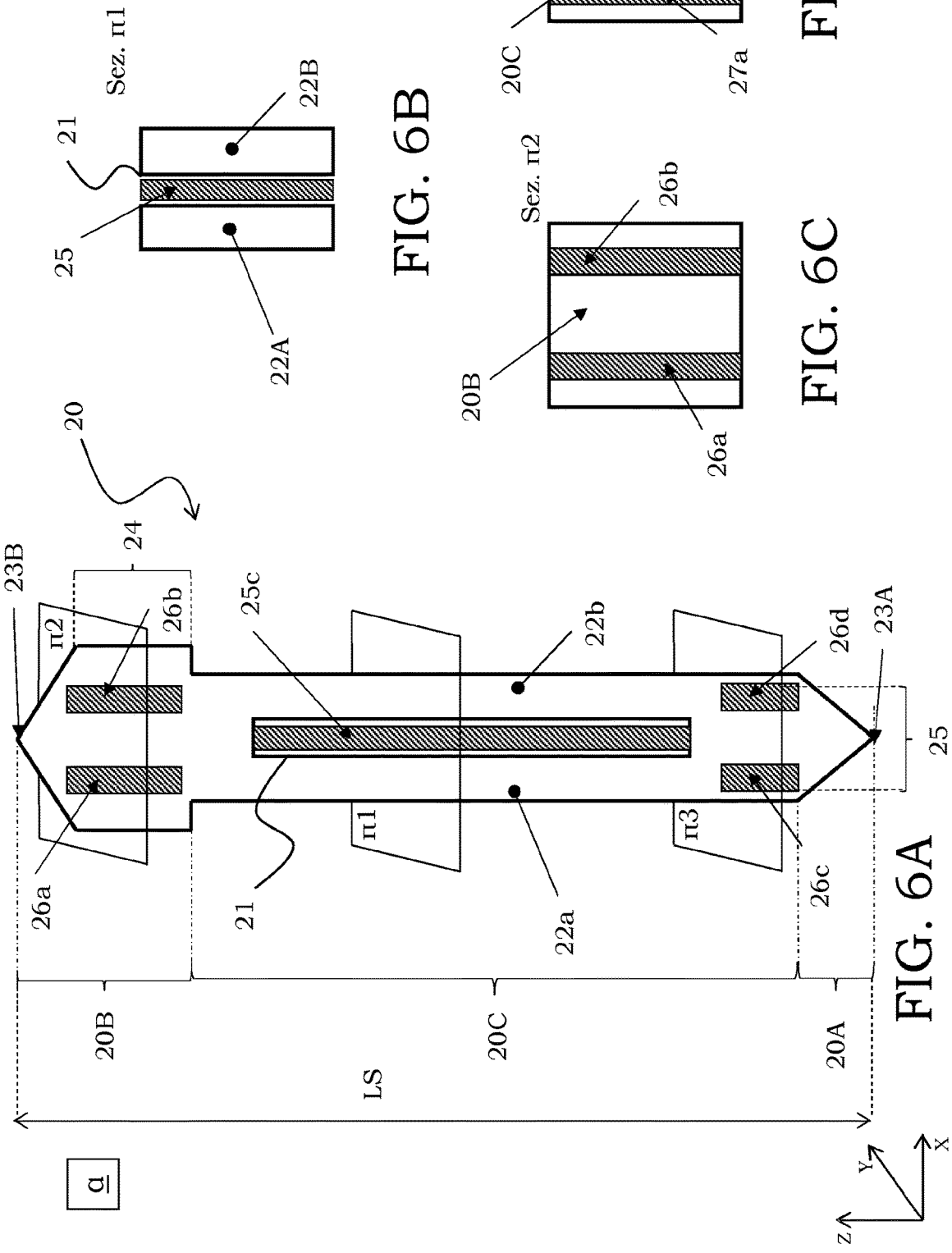

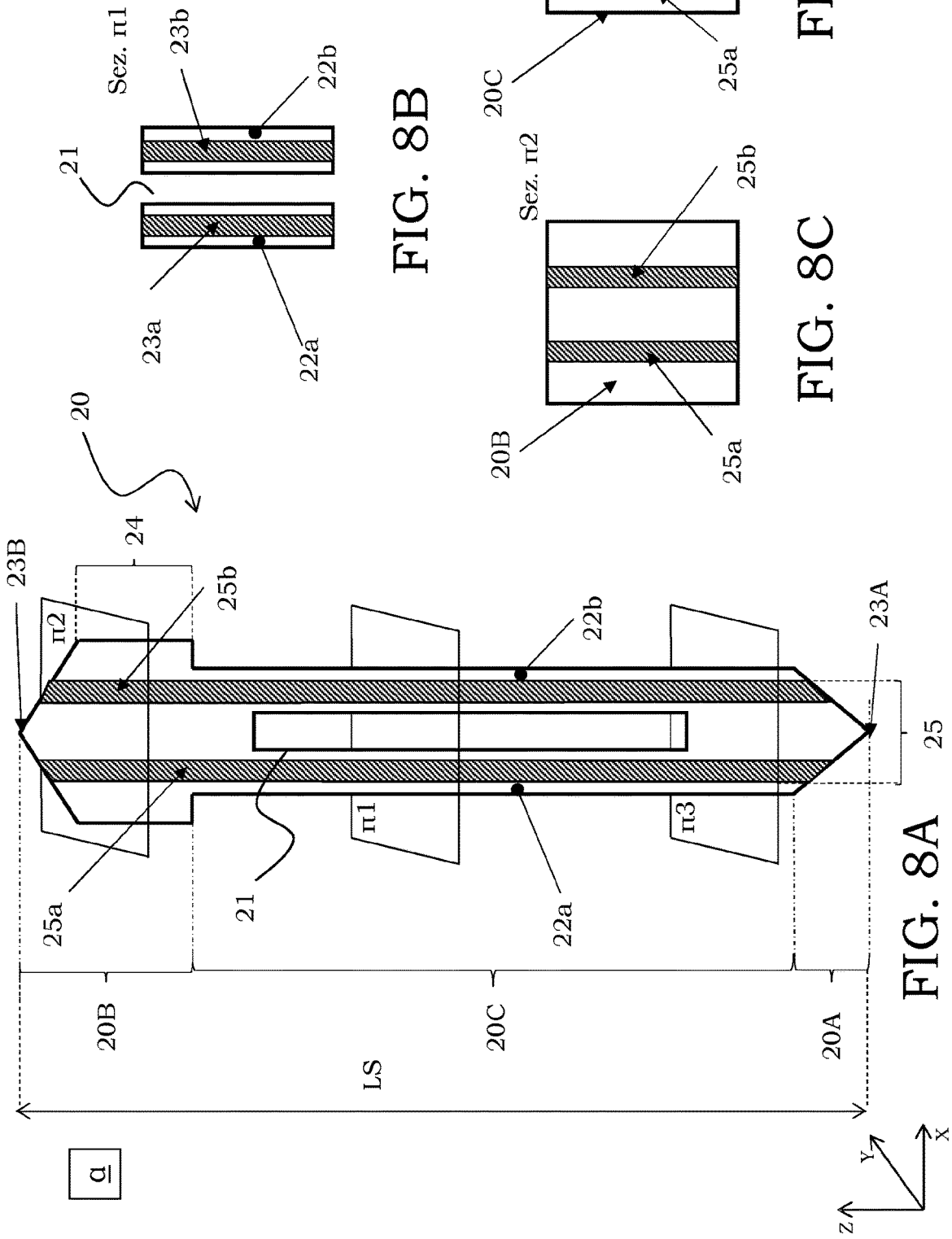

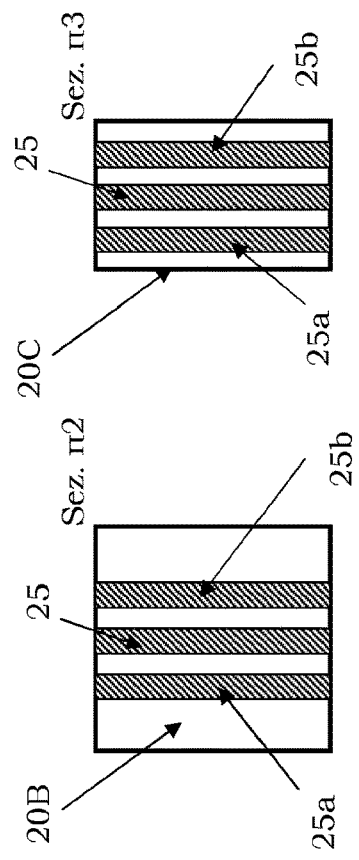
FIG. 10B
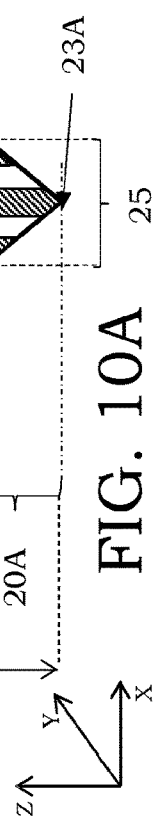
FIG. 10D
FIG. 10C
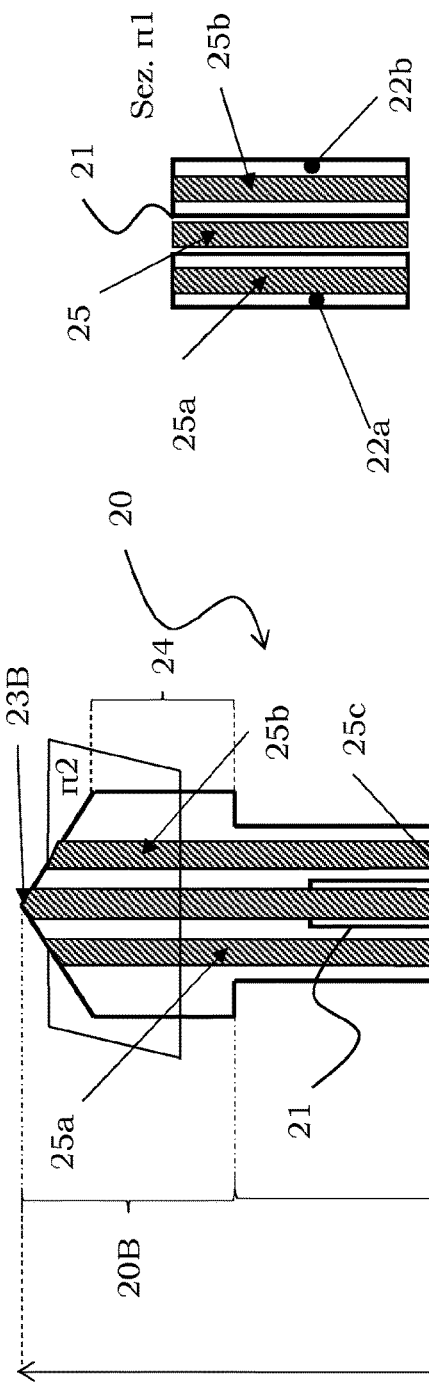
FIG. 10A

CONTACT PROBE FOR HIGH-FREQUENCY APPLICATIONS WITH IMPROVED CURRENT CAPACITY

CROSS-REFERENCE TO RELATED APPLICATIONS

This application is a 371 of PCT/EP2020/085593, filed Dec. 10, 2020, which claims the benefit of Italian Patent Application No. 102019000024889, filed Dec. 19, 2019.

FIELD OF APPLICATION

The present invention relates to a contact probe for high-frequency applications with improved current capacity.

The invention relates, in particular, but not exclusively, to a contact probe adapted to be housed in a vertical probe head for testing electronic devices integrated on a wafer and the following description is made with reference to this field of application with the sole aim of simplifying the description thereof.

PRIOR ART

As it is well known, a probe head is a device adapted to electrically connect a plurality of pads or contact pads of a microstructure, for instance an integrated circuit, with corresponding channels of a testing apparatus.

The test, which is performed on integrated devices, is particularly useful for detecting and isolating defective devices as early as in the production phase. Usually, probe heads are therefore used for the electrical testing of devices integrated on a wafer before cutting and assembling them inside a chip containment package. It is known to indicate an integrated circuit subjected to such testing operations as DUT (acronym from English: "Device Under Test").

A probe head may essentially comprise a plurality of movable contact elements or contact probes held by at least one pair of supports or dies which are substantially plate-shaped and parallel to each other. Said plate-shaped supports are provided with suitable holes and are placed at a certain distance from each other so as to leave a free space or air gap for the movement and possible deformation of the contact probes during the testing operations. The pair of plate-shaped supports comprises in particular an upper plate-shaped support or upper die and a lower plate-shaped support or lower die, both provided with respective guide holes within which the contact probes axially slide, usually formed by wires of special alloys having good electrical and mechanical properties.

The good connection between contact probes and contact pads of the device under test is ensured by the pressure of the probe head on the device itself, the contact probes, which are movable within the guide holes made in the upper and lower plate-shaped supports, undergoing, during said pressing contact, a bending inside the air gap between the two plate-shaped supports and a sliding inside the guide holes. Probe heads of this type are commonly called probe heads with vertical probes or "vertical probe head".

In some cases, the contact probes are fixedly fastened to the head itself at the upper plate-shaped support: such probe heads are referred to as "blocked probe heads".

However, more frequently contact heads with probes that are not be fixedly fastened but held interfaced to a so-called board, possibly by a microcontact board, are used: such probe heads are referred to as "unblocked probe heads". The micro-contact board is usually called "space transformer" since, besides contacting the probes, it also allows spatially redistributing the contact pads realized thereon with respect to the contact pads of the device under test, in particular relaxing the distance constraints between the centers of the pads made on the space transformer with respect to those made on the device under test, which are instead fixed by the architecture and technology of the device itself.

The correct operation of a vertical probe head is basically linked to two parameters: the vertical movement, or over-travel, of the contact probes and the horizontal movement, or scrub, of the contact tips of said contact probes on the contact pads of the device under test. Indeed, it is notoriously important to ensure the scrub of the contact tips so as to allow superficially scratching the contact pads removing the impurities for instance in the form of a thin layer or film of oxide, thus improving the contact performed by said contact probes and thus by the probe head as a whole.

All these features should be evaluated and calibrated in the manufacturing step of a probe head, since the proper electrical connection between probes and device under test, in particular between contact tips of the probes and contact pads of the device under test, should always be ensured.

Equally important is to ensure that the pressing contact of the contact tips of the probes onto the contact pads of the device is not so high as to cause the probe or the pad itself to break.

This problem is particularly felt in case of the so-called short probes, i.e. probes with rod-shaped body limited in length and in particular with overall dimensions lower than 5000-7000 μm. Probes of this type are used for instance for high-frequency applications, the reduced length of the probes limiting the self-inductance phenomenon connected to the transmission of high-frequency signals. In particular, the term "high-frequency applications" indicates probes capable of carrying signals with frequencies greater than 1000 MHz.

In this case, however, the reduced length of the contact probes dramatically increases the rigidity of the probes themselves, which implies an increase in the force exerted by the respective contact tips onto the contact pads, for instance of a device under test, which may cause said pads to break, with irreparable damage to the device under test, a situation which is obviously to be avoided. Even more dangerously, the increase in the rigidity of the contact probes due to the reduction of the overall length increases the risk of breaking the probes themselves.

It is known to decrease the short probe rigidity by making their respective body portions in the form of a plurality of arms, parallel to each other and extended longitudinally along said body portions, as schematically illustrated in FIGS. 1A and 1B. A probe head comprising contact probes with respective body portions formed by a plurality of arms is described for instance in the international patent application (PCT) published with No. WO 2016/146476 on 22 Sep. 2016 in name of the same Applicant.

More particularly, with reference to said figures, a contact probe 10 is shown, comprising a body 10C extended between a first and a second end portion, in particular a so-called contact tip 10A adapted to abut onto a contact pad of a device under test (not illustrated) and a so-called contact head 10B adapted to abut onto a further contact pad for connecting with a testing apparatus, in particular a contact pad of a space transformer connected to said testing apparatus (being also not illustrated).

In the case of a co-called short probe, used for instance for high-frequency applications, the contact probe 10 has a length L less than 5000-7000 μm.

In the embodiment illustrated in FIG. 1A, the probe body 10C comprises a cut or slot 11 that runs longitudinally along said body 10C and defines at least one pair of arms 12a and 12b.

It is obviously possible to make the probe body 10C even by a plurality of arms thanks to the realization of a corresponding plurality of longitudinal slots. For instance, in the embodiment illustrated in FIG. 1B, the body 10C of the contact probe 10 comprises two longitudinal slots 11a and 11b which form three arms 12a, 12b and 12c.

The contact tip 10A and the contact head 10B usually have a tapered shape and end with respective contact areas 13A and 13B.

The term "contact area" indicates herein and in the following an end area of a contact probe intended to contact the device under test or the testing apparatus, said contact area or end area not being necessarily pointed as shown in the figures. Usually, the contact area has a limited surface area, in particular with extension less than a transversal section of the corresponding end portion and may be arranged centrally thereto with respect to a longitudinal symmetry axis of the contact probe 10 or eccentrically with respect thereto.

Suitably, the contact head 10B also comprises an enlarged portion 14 having a diameter D2 greater than a diameter D1 of the body 10C of the contact probe 10; in this way, respective undercut portions 14s of the enlarged portion 14 with respect to the probe body 10C are defined, which are adapted to abut onto a guide that houses said contact probe 10, so as to provide a holding thereof in its longitudinal direction.

As already stated, the electrical contact between contact probes 10 and space transformer on the one hand and device under test on the other (not illustrated in the figures) is obtained by pressure abutment of the contact areas 13a, 13b of the probes onto the respective contact pads.

Suitably, the presence of the arms 12a-12c formed in the probe body 10C is capable of decreasing the rigidity of the probe 10 as a whole and as a result the pressure exerted thereby onto the respective contact pads, while maintaining a sufficient elasticity of the probe body capable of ensuring the bending thereof during the pressing contact of the contact areas thereof 13a, 13b onto the contact pads.

Though improving the operation of the contact probe 10 from a mechanical point of view, the presence of the arms formed in the body thereof 10C entails a decrease of the current capacity of the probe, increasing the electrical resistance thereof, which prevents its use for carrying high-frequency and high-current signals, the term "high current" indicating signals with current values greater than 800 mA.

The technical problem of the present invention is thus to conceive a contact probe having functional and structural features such as to allow the use in high-frequency applications for carrying high-frequency signals, while ensuring a correct operation of the probe at such current values, but also a sufficient elasticity of the contact probes and thus a decreased risk of breakage of the same, as well as a suitable force that the related contact areas exert while abutting onto corresponding contact pads, thus overcoming the limitations and drawbacks that still affect the contact probes made according to the prior art.

SUMMARY OF THE INVENTION

The solution idea underlying the present invention is to provide a contact probe comprising at least one conductive insert arranged according to its longitudinal development direction, capable of increasing the ability of the probe to carry current, making it suitable to carry high-current signals thus minimizing its electrical resistance, the probe also having a body made by a plurality of arms so as to be able to make short probes suitable for high-frequency applications.

In particular, the contact probe made according to an embodiment comprises such a conductive insert arranged in its bending plane, preferably as much as possible along a neutral axis of said probe, namely in a position of minimum stress, so as to maximize the current capacity and to minimize the electricality resistance thereof, at the same time without affecting the mechanical performance of the probe, throughout the operating temperature range of the same.

Based on said solution idea the technical problem is solved by a contact probe comprising a probe body extended between a first end portion and a second end portion and provided with at least one pair of arms separated by a slot made in the probe body according to a development direction of the contact probe, characterized in that it comprises at least one conductive insert extended inside said contact probe along the longitudinal development direction arranged in a bending plane of the contact probe, said conductive insert being made of a first material having electrical resistivity lower than an electrical resistivity of a second material which the contact probe is made of, the conductive insert being a carrying current element and the arms being structural support elements of the contact probe during a deformation of the probe body.

More particularly, the invention comprises the following additional and optional features, taken singularly or in combination if necessary.

According to an aspect of the invention, the first material may have an electrical resistivity lower than 30 $\mu\Omega$*cm.

In particular, the first material may be a low-electrical resistivity conductive or semiconductor material selected from gold (Au), copper (Cu), silver (Ag), aluminum (Al), platinum (Pt) and alloys thereof, preferably silver, and said second material may be a structurally stable conductive material selected from nickel, tungsten, cobalt, palladium or alloys thereof, such as the nickel-manganese, nickel-cobalt, nickel-palladium or nickel-tungsten, palladium-cobalt alloys, palladium-based ternary and quaternary alloys, preferably palladium-cobalt.

Still according to another aspect of the invention, the conductive insert may have a transversal dimension that is orthogonal to the longitudinal development direction that is lower than corresponding transversal dimensions of the arms, preferably lower than 20 $\mu$m.

In particular, the transversal dimension of the conductive insert may be equal to 20%-60% of a minimum value of said corresponding transversal dimensions of the arms.

Furthermore, according to another aspect of the invention, the conductive insert may be arranged substantially at a minimum stress position along a neutral axis of the contact probe in the bending plane.

Suitably, the conductive insert may be placed within the slot.

Furthermore, the conductive insert may comprise a plurality of parallel foils placed within said slot.

Alternatively, according to another aspect of the invention, the conductive insert may be made inside one of the arms.

The contact probe may also comprise at least one arm made of the first electrical low-resistivity material so as to form the conductive insert.

According to a further aspect of the invention, the conductive insert may have a length equal to a length of the slot.

Furthermore, the probe body may comprise an alternation of arms and conductive inserts.

According to another aspect of the invention, the conductive insert may comprise a central conductive insert positioned within the slot and additional conductive portions made by means of the first material and completely embedded in the second material that forms the contact probe, preferably made in the first end portion and second end portion of said contact probe.

Suitably, the conductive insert may extend along the entire contact probe and emerge with respect to the second material at a first contact area and a second contact area made at the first end portion and second end portion of the contact probe, respectively.

Furthermore, the conductive insert may comprise at least one conductive insert longitudinally extended in each of the arms.

Furthermore, the conductive inserts extended in each of the arms may be made so as to be completely incorporated in the second material which forms the arms or to emerge at side walls of said slot.

In this case said conductive insert may further comprise a central conductive insert positioned at the slot.

According to another aspect of the invention, the conductive insert may have a length along the longitudinal development direction that is lower than a length of the contact probe.

Alternatively, the conductive insert may have a length along the longitudinal development direction such as to emerge from the second material that forms the contact probe.

The technical problem of the present invention is also solved by a probe head for testing the functionality of an integrated device under test including a plurality of contact probes provided with at least one end portion adapted to abut onto contact pads of the integrated device under test, characterized in that it comprises contact probes made as above indicated and having probe bodies provided with arms and at least one conductive insert.

According to another aspect of the invention, said probe head may comprise a first plurality of contact probes having probe bodies provided with arms and at least one conductive insert and a second plurality of contact probes having probe bodies provided with arms and missing at least one conductive insert.

Furthermore, the probe head may only comprise contact probes having probe bodies provided with arms and with at least one conductive insert.

The characteristics and advantages of the contact probe according to the invention will be apparent from the description, made hereinafter, of an embodiment thereof, given by indicative and non-limiting example, with reference to the accompanying drawings.

BRIEF DESCRIPTION OF THE DRAWINGS

In such drawings:

FIGS. 2A-2D schematically show a frontal view in longitudinal section and respective views in transversal section of an embodiment of the contact probe according to an embodiment of the invention;

FIGS. 3A-3D, 4A-4d, 5A-5D, 6A-6D, 7A-7D, 8A-8D, 9A-9D and 10A-10D schematically show respective frontal views in longitudinal section and views in transversal section of alternative embodiments of the contact probe.

DETAILED DESCRIPTION

Figure 1B:
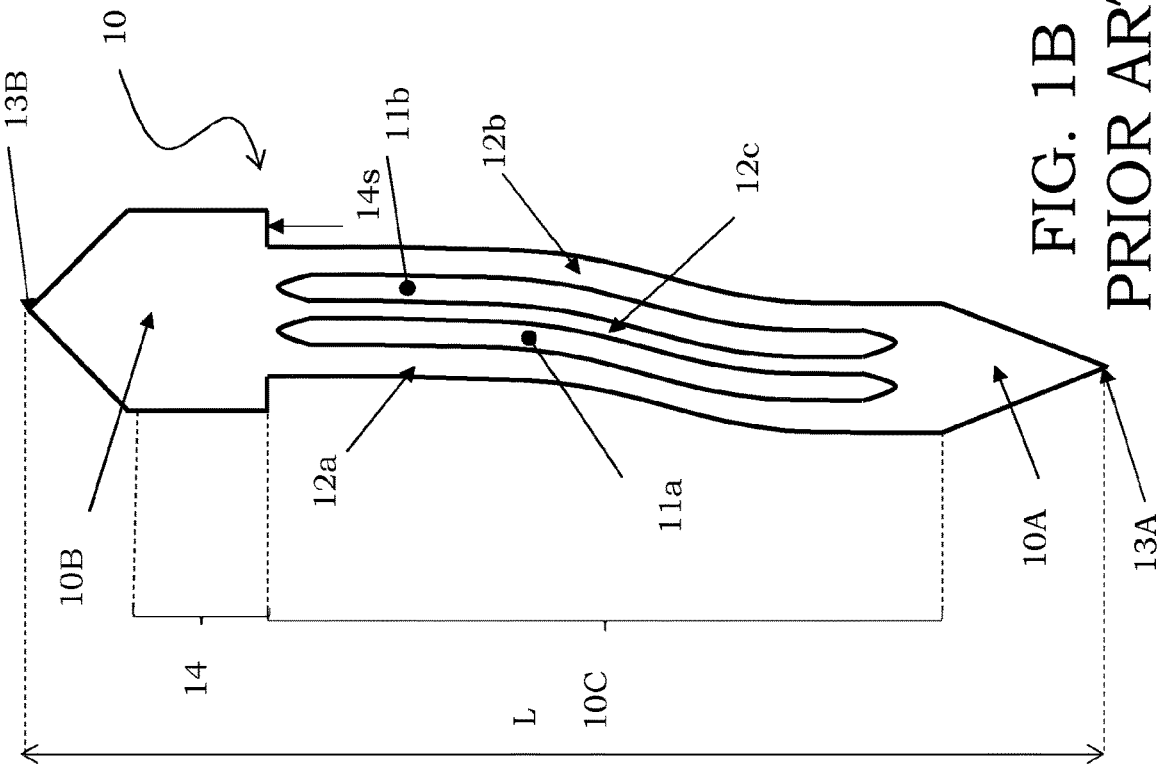
FIGS. 1A and 1B schematically show different embodiments of a contact probe made according to the prior art.
Figure 1A:
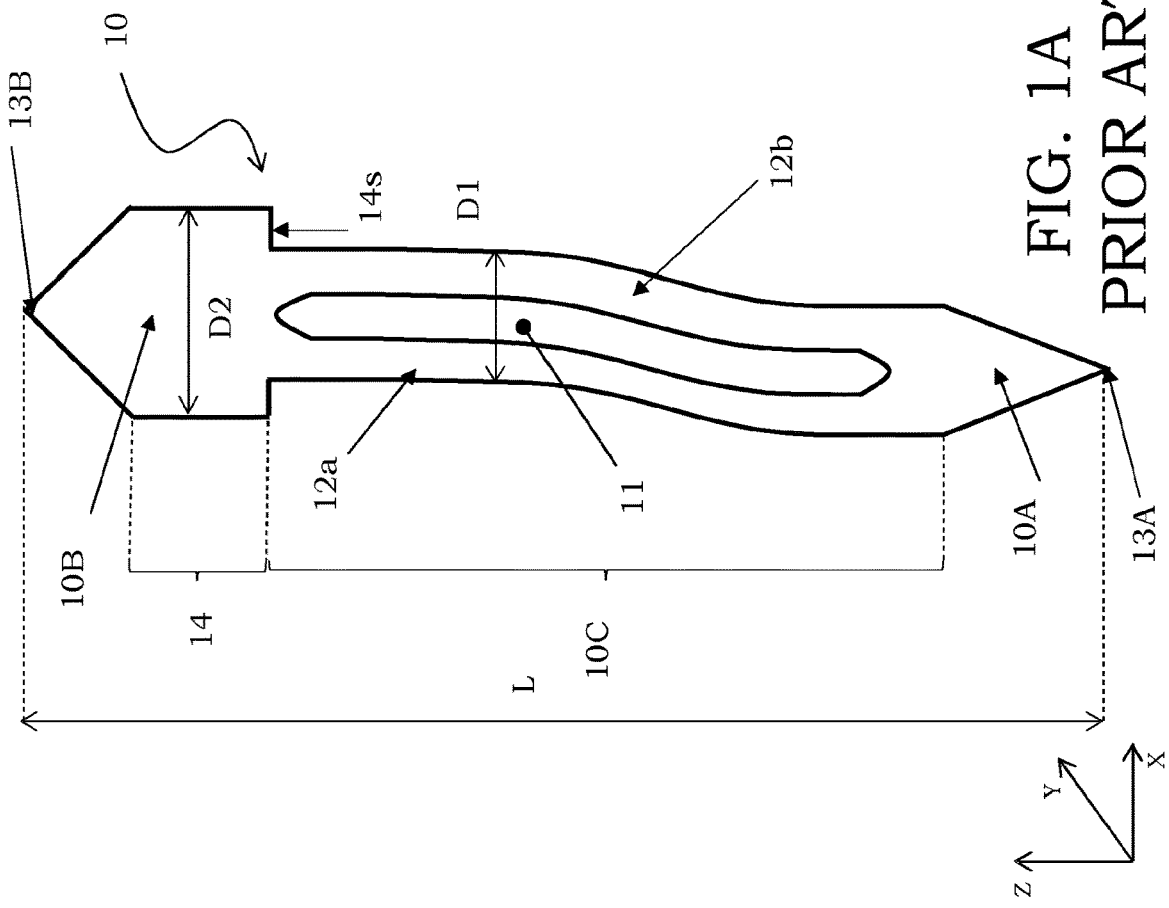

With reference to said figures, and in particular to FIG. 2A, it is herein described a contact probe made according to an embodiment of the invention, which is globally indicated with reference number 20.

It should be noted that the figures represent schematic views and are not drawn to scale, but instead they are drawn so as to enhance the important features of the invention. Furthermore, in the figures, the different pieces are shown schematically, since their shape may vary according to the desired application.

As seen in connection with the known solutions, the contact probe 20 comprises a probe body 20C extended between a first and a second end portion, in particular a contact tip 20A adapted to abut onto a contact pad of a device under test (not illustrated) and a contact head 20B adapted to abut onto a further contact pad of a space transformer connected to a testing apparatus (in turn not illustrated).

Suitably, the contact probe 20 may be a so-called a short probe which has an overall length LS less than 6000 µm so as to be suitable for high-frequency applications.

In an embodiment example, the probe body 20C may have a length LC comprised between 500 µm and 4000 µm, the contact tip 20A may have a length LA comprised between 150 µm and 1000 µm and the contact head 20B may have a length LB comprised between 50 µm and 500 µm, the overall length LS of the contact probe 20 being comprised between 700 µm and 5500 µm.

In the embodiment illustrated in FIG. 2A, the probe body 20C comprises a slot 21 that runs along the probe body 20C in its longitudinal development direction (namely according to an axis z of the local reference of the figure) and defines at least one pair of arms 22a and 22b. In particular, the slot 21 extends longitudinally by a length L1 equal to or less than a length LC of the probe body 20C, for instance comprised between 500 µm and 4000 µm and may be positioned centrally with respect to said probe body 20C, as shown in said figure. Furthermore, the slot 21 has a transversal dimension D1, perpendicularly to the longitudinal development direction of the contact probe 20 (i.e. according to an axis x of the local reference of the figure), having a value comprised between 5 µm and 50 µm, so as to make arms 22a and 22b with respective transversal dimensions D2a and D2b having values comprised between 5 µm and 40 µm.

In the embodiment illustrated in FIG. 2A, the arms 22a and 22b have transversal dimensions D2a and D2b of equal value but it is obviously possible to make arms having transversal dimensions of different value, obtained for instance by means of a slot 21 positioned not centrally with respect to the transversal extension of the probe body 20C.

It is obviously possible to also make the probe body 20C by means of a plurality of arms thanks to the realization of a corresponding plurality of longitudinal slots, dimensioned and spaced apart from each other according to the application needs of the final contact probe 20.

The contact tip 20A and the contact head 20B preferably have a tapered shape and end with a first and a second contact area 23A and 23B, respectively, adapted to go in pressing contact onto respective contact pads of a device under test and of a space transformer, respectively. Said contact areas are not necessarily pointed and/or positioned centrally with respect to the corresponding end portion.

Suitably, the contact head 20B may also comprise an enlarged portion 24 having a diameter Db greater than a diameter Dc of the probe body 20C, the term diameter indicating herein and in the following a maximum transversal dimension, even in the case of non-circular elements.

In this way, respective undercut portions 24s of the enlarged portion 24 with respect to the probe body 20C are defined, which are adapted to abut onto a guide that houses the contact probes 20, so as to realize a retainment thereof in the longitudinal direction (i.e. according to the axis z of the local reference of the figure), avoiding for instance that probes may slip out of the probe head that houses them when the same is not in pressing contact on a device under test or during the cleaning operations.

More particularly, the diameter Dc of the probe body 20C has values comprised between 15 μm and 130 μm and the diameter Db of the enlarged portion 24 has values comprised between 25 μm and 200 μm.

Suitably, the contact probe 20 according to an embodiment also comprises a conductive insert 25 extended within the probe along the longitudinal development direction thereof. More particularly, the conductive insert 25 is made of a conductor or semiconductor material having a lower electrical resistivity than an electrical resistivity of a material the contact probe 20 is made of; furthermore, the conductive insert 25 is arranged in a bending plane α of the contact probe 20, i.e. the plane defined by axes x and z indicated in the figure corresponding to the plane of the figure sheet.

Preferably, said conductive insert 25 is arranged in said bending plane α substantially along the so-called neutral axis of the contact probe 20, i.e. in a minimum stress position of the probe itself in said bending plane α. In particular, as it is well known, a neutral axis is an axis in a cross section of a beam or shaft, such as the contact probe, along which there are no longitudinal stresses or strains.

In this way, the conductive insert 25 is able to maximize the current capacity of the contact probe 20, minimizing the electrical resistance thereof, and meanwhile not to affect the mechanical performance of the probe as a whole. It is verified that the contact probe 20 maintains these features in all its operating temperature range, i.e. between −55° C. and +150° C. and above.

Said conductive insert 25 has a reduced transversal dimension D, in particular less than the transversal dimension D2a and D2b of the arms 22a and 22b of the probe body 20C (D<D2a and D<D2b).

In this way, the conductive insert 25 has the main function of increasing the current capacity of the contact probe 20, whereas the arms 22a and 22b have a prevalent bearing function, said different functions being determined by the transversal dimensions of said elements in addition to the material which they are made of.

In the following, the material which the contact probe 20 is made of will be indicated as "structurally stable material" and the material which the conductive insert 25 is made of as "low-electrical resistivity material", precisely to stress the different function of said elements.

The contact probe 20 comprising the conductive insert 25 is suitable to carry high-current signals, i.e. signals having a current with a value greater than 800 mA.

The conductive insert 25 preferably has a transversal dimension D equal to 20%-60% of a minimum value of the transversal dimensions D2a, D2b of the arms 22a, 22b.

More particularly, the conductive insert 25 may be in the shape of a metal foil positioned along the probe body 20C and having a length at least equal to the length L1 of the slot 21, said metal foil being arranged within the slot 21 itself, preferably centrally with respect thereto.

In particular said conductive insert 25 has a transversal dimension D of a particularly reduced value, preferably less than 20 μm.

In this way, the conductive insert 25 in practice does not perform any structural support function in the contact probe 20, the bearing effect being given by the side arms 22a and 22b having diameters D2a and D2b greater than the diameter D of the conductive insert 25 and being made of a material that is structurally more stable with respect to the one which the conductive insert 25 is made of. The presence of said conductive insert 25 increases the overall capacity of the contact probe 20 of carrying current, instead, since it is made of a low-electrical resistivity material, i.e. high conductivity.

The low-electrical resistivity material which the conductive insert 25 is made of may be a metal chosen among gold (Au), copper (Cu), silver (Ag), aluminum (Al), platinum (Pt) and alloys thereof, preferably silver, or a semiconductor material suitably doped, whereas the structurally stable material forming the contact probe 20 may be chosen among nickel, tungsten, cobalt, palladium or alloys thereof, such as nickel-manganese, nickel-cobalt, nickel-palladium or nickel-tungsten, palladium-cobalt alloys, palladium-based ternary and quaternary alloys, preferably palladium-cobalt. More particularly, the material which the conductive insert 25 is made of has an electrical resistivity (p) less than 30 μΩ*cm.

Essentially, the structurally stable material which the contact probe 20 is made of is chosen so as to ensure the integrity of the probe during its pressing contact on the device under test and therefore its bending, whereas the low-electrical resistivity material which the conductive insert 25 is made of is chosen so as to maximize the current capacity of the contact probe 20 which includes it, decreasing the resistance value thereof.

Furthermore, the presence of the side arms 22a and 22b helps shielding the so-called wire current due to the current flowing in the conductive insert 25 when positioned inside said side arms 22a and 22b, the shielding action being particularly advantageous for radiofrequency applications (RF).

In the embodiment of FIG. 2A, the conductive insert 25 only extends in the slot 21, as shown by the sections of FIGS. 2B-2D, taken at the transversal planes π1-π3 indicated in FIG. 2A, in particular a first plane π1, positioned at the slot 21 and at the conductive insert 25, a second plane π2, positioned at the contact head 20B, in particular at the enlarged portion 24 of diameter Db, and a third plane π3, positioned at the probe body 20C of diameter Dc, where the slot 21 is not present.

It is emphasized that in this embodiment, the conductive insert 25 is suitably positioned in a low-effort area, the material which it is made of being thus subjected to a minimum traction and compression effort. In this way it is possible to control the yield of the low-electrical resistivity material which the conductive insert 25 is made of and to maintain the hot relaxation performance of the structurally stable material which the rest of the contact probe 20 is made of. The conductive insert 25 in particular may be positioned in the bending plane α of the contact probe 20 at the neutral axis thereof, i.e. in the least stress position.

Suitably, based on the values of the diameter Dc of the probe body 20C and of the diameter D1 of the slot 21, it is possible to make the conductive insert 25 in the shape of a plurality of parallel foils made of a low-electrical resistivity conductor or semiconductor material, so as to minimize the electrical resistivity and to maximize the current capacity without significantly increasing the force of the contact probe 20 during the impact, since the influence of these thin foils on the mechanical performance of the contact probe 20 is limited. Furthermore, it is emphasized that also in this case the foils may be suitably kept in a minimum traction and compression effort area, i.e. in the slot 21.

It is also possible to make the probe body 20C by means of an alternation of bearing arms and conductive inserts.

Generally, the arrangement and number of conductive inserts and bearing arms is determined always considering the pitch values of the pads of the device under test and so as to avoid any possible contact between conductive inserts and/or bearing arms, which could create electrical but also mechanical problems, the contact between said elements being able to lead to greater forces during the impact of the contact probe onto the contact pads with consequent risks of breakage.

Suitably according to the present embodiment, the conductive insert 25, positioned in the slot 21, is separated by the bearing arms 22a and 22b through air, which acts as electrical insulation and mechanical separator.

Alternatively, the contact probe 20 may comprise the conductive insert 25 arranged within a bearing arm, for instance the bearing arm 22a as illustrated in FIG. 3A or a plurality of conductive inserts 25a and 25b, each arranged within a bearing arm 22a and 22b, as illustrated in FIG. 4A; in this way, the insert or conductive inserts are completely embedded in the structurally stable material which forms the contact probe 20, as shown in the sections of FIGS. 3B-3D and 4B-4D, still taken at the planes $\pi 1$-$\pi 3$ indicated in FIGS. 3A and 4A and positioned as those of FIG. 2A.

It is emphasized that, according to said embodiment alternatives, the structurally stable material which the probe, and in particular the bearing arms 22a and 22b, is made of decreases the risk of breakage of the insert 25 or of the inserts 25a, 25b embedded therein and made of the low-electrical resistivity material that is mechanically weaker.

Though not illustrated in FIGS. 3A e 4A, it is also possible to make the conductive insert 25 or the conductive inserts 25a and 25b with dimensions greater than those of the slot 21.

According to an embodiment alternative illustrated in FIG. 5A, the contact probe 20 may also comprise an arm made of the low-electrical resistivity material so as to form the central conductive insert 25; in this case, the contact probe 20 comprises the conductive insert 25 and a bearing arm 22b separated by the slot 21, as shown in the sections of.

FIGS. 5B-5D, still taken at the planes $\pi 1$-$\pi 3$ indicated in FIG. 5A and positioned as previously.

In this case said conductive insert 25 has dimensions analogous to those of the bearing arm 22b.

Though not illustrated in FIG. 5A, it is also possible to make both arms 22a and 22b of the low-electrical resistivity material; in this case, the contact probe 20 will comprise a pair of conductive inserts separated by the slot 21.

According to a further alternative embodiment illustrated in FIG. 6A, the conductive insert 25 may comprise a central conductive insert 25c positioned in the slot 21 as the embodiment illustrated in FIG. 2A and additional conductive portions 26a-26d, in any case formed by means of a low-electrical resistivity material and positioned in the contact head 20B and in the probe body 20C close to the contact tip 20A so as to be completely embedded in the structurally stable material that forms the contact probe 20, as shown in the sections of FIGS. 6B-6D, still taken at the planes $\pi 1$-$\pi 3$ indicated in FIG. 6A and positioned as previously.

These additional conductive portions 26a-26d allow further increasing the overall current capacity of the contact probe 20 with respect to the embodiment shown in FIG. 2A, even in the event in which the overall dimensions of the contact probe 20 do not allow housing a conductive insert having a diameter D that is sufficiently large or formed by a plurality of foils suitable for carrying a current value greater than 800 mA. It is emphasized that, being these additional conductive portions 26a-26d completely embedded in the contact probe 20, in particular in the structurally stable material which it is formed of and which is mechanically more resistant with respect to the low-electrical resistivity material which the conductive insert 25 is made of, the same allow increasing the current capacity of the contact probe 20 without significantly affecting the structural stability thereof.

Figure 7A:
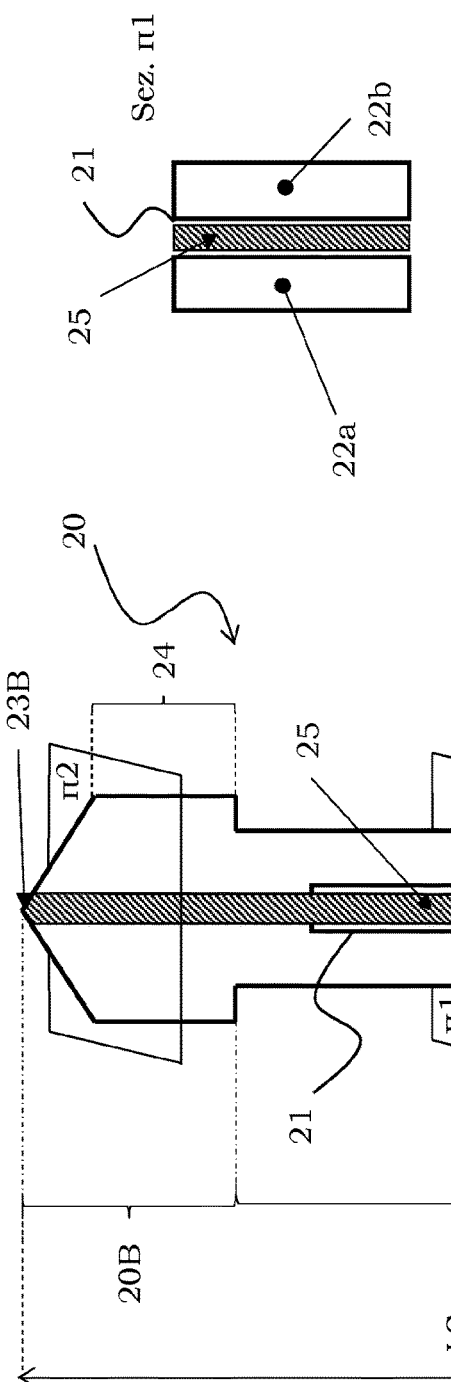
Figure 7B:
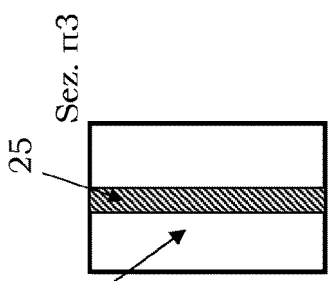
Figure 7C:
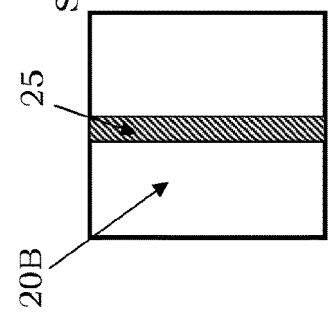
Figure 7D:
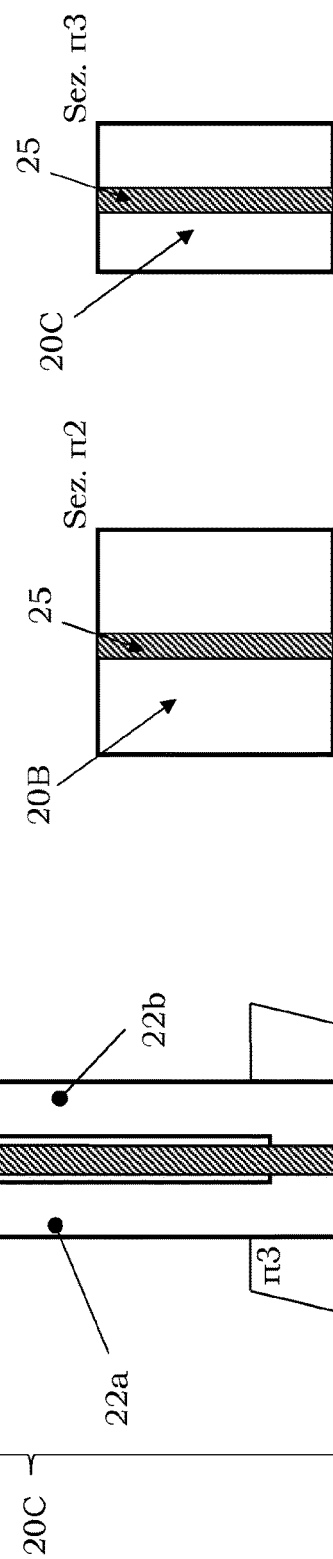

Alternatively, as illustrated in FIG. 7A, the contact probe 20 comprises a conductive insert 25 made so as to extend along the entire the contact probe 20, for instance at a central portion from the slot 21 but which also develops outside said slot 21, in particular along the contact tip 20A up to the first contact area 23A and along the contact head 20B up to the second contact area 23B, as shown in the sections of FIGS. 7B-7D, still taken at the planes $\pi 1$-$\pi 3$ indicated in FIG. 7A and positioned as previously.

In this way, the conductive insert 25 further increases the current capacity of the contact probe 20, with respect for instance to the embodiment illustrated in FIG. 2A, without introducing fragility areas thanks to its partial embedment, in particular at the contact tip 20A and at the contact head 20B, in the structurally stable material which the contact probe 20 is made of. Furthermore, such a conductive insert 25 which extends from the contact head 20B to the contact tip 20A of the contact probe 20, along the entire longitudinal development thereof, suitably makes a preferential not interrupted path for the current which flows through said probe.

According to a further alternative embodiment illustrated in FIG. 8A, the contact probe 20 comprises a conductive insert 25 formed by at least two conductive inserts 25a and 25b longitudinally extended and positioned at the two arms 22a and 22b, in particular at the center thereof, so as to be incorporated by the structurally stable material which the contact probe 20 is made of. In the embodiment illustrated in this figure, the conductive inserts 25a and 25b extend along the entire extension of the contact probe 20 up to the edges of the contact tip 20A and of the contact head 20B, so as to emerge with respect to the structurally stable material which the contact probe 20 is made of, as shown in the sections of FIGS. 8B-8D, still taken at the planes $\pi 1$-$\pi 3$ indicated in FIG. 8A and positioned as previously.

Obviously, it is possible to make the conductive inserts 25a and 25b extended in the arms 22a and 22b only at the slot 21 or anyway by a length less than the overall length of the contact probe 20, so as to be completely embedded in the structurally stable material which it is made of, the length of said conductive inserts 25a and 25b being chosen based on the current capacity required for the contact probe 20 according to its specific application.

Figure 9A:
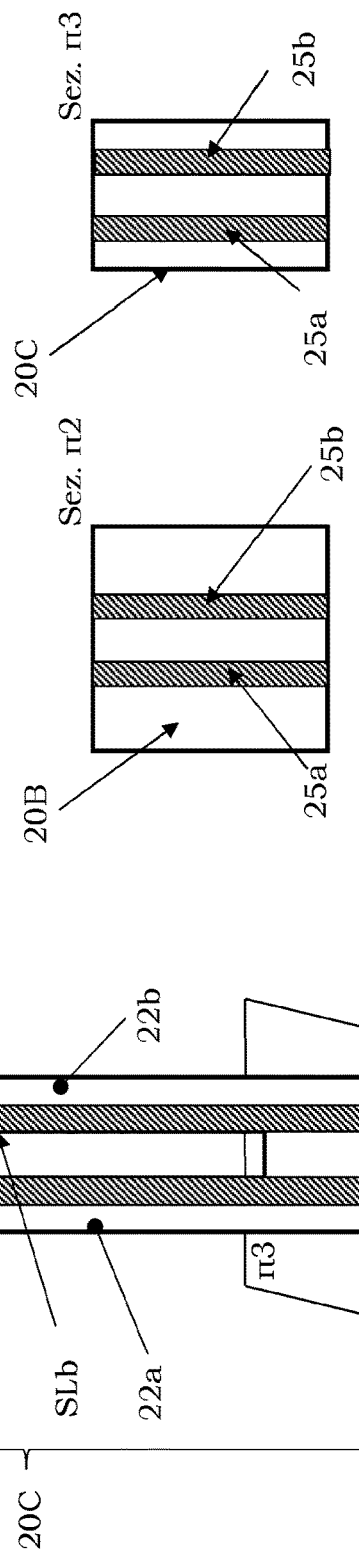
Figure 9B:
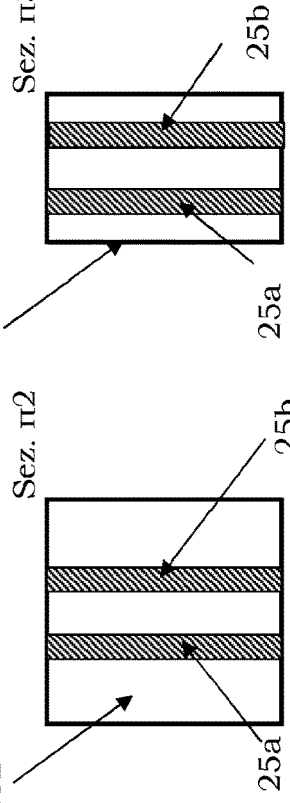
Figure 9C:
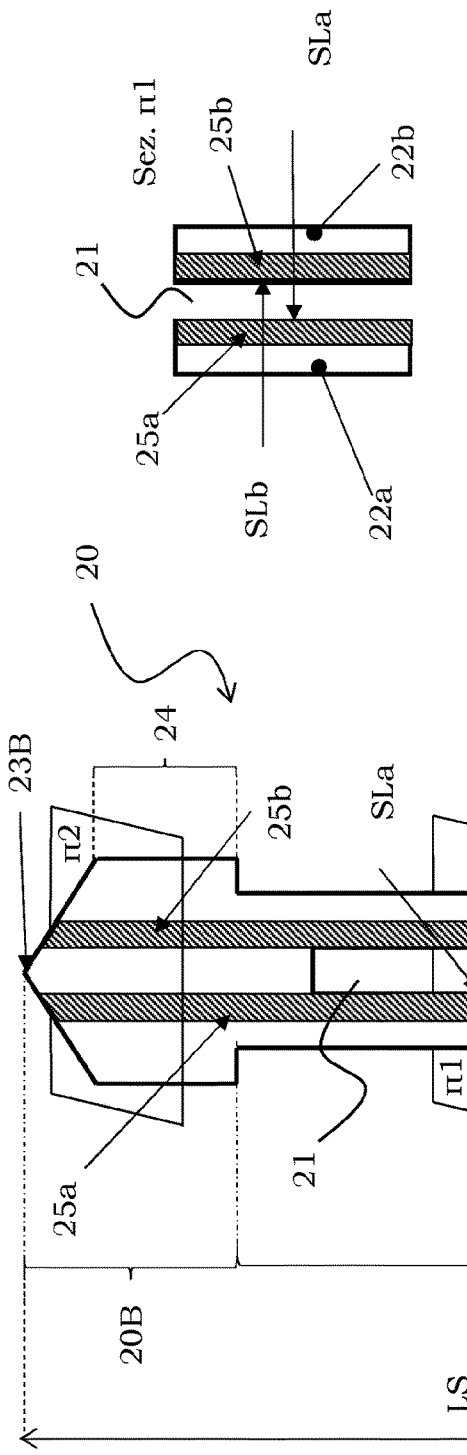
Figure 9D:

Furthermore, it is possible to make the conductive inserts 25a and 25b extended in the arms 22a and 22b, so as to emerge at the slot 21, as illustrated in FIG. 9A; more particularly, the conductive inserts 25a and 25b are made at the side walls SLa and SLb of the slot 21 itself, as shown in the sections of FIGS. 9B-9D, still taken at the planes π1-π3 indicated in FIG. 9A and positioned as previously.

In this way, the contact probe 20 appears to be compatible with different manufacturing methods used in the field of the invention, adapting to manufacturing processes with different constraints.

Furthermore, it is possible to make a contact probe 20 having a conductive insert 25 formed by a plurality of conductive inserts longitudinally extended in the contact probe 20, as shown in FIG. 10A; in particular, the conductive insert 25 comprises in this way a pair of conductive inserts 25a and 25b positioned at the arms 22a and 22b and a central conductive insert 25c positioned in the slot 21. In the embodiment illustrated, the conductive inserts 25a and 25b extend along the entire extension of the contact probe 20 up to the edges of the contact tip 20a and of the contact head 20B and the central conductive insert 25c extends up to the contact areas 23a and 23b, as shown in the sections of FIGS. 10B-10D, taken at the planes π1-π3 indicated in FIG. 10A and positioned as previously.

Such a conductive insert 25 allows maximizing the overall current capacity of the contact probe 20 with respect to the previously described embodiments, without significantly affecting its mechanical behaviour, which remains dictated by the structurally stable material which it is made of and without increasing its overall transversal dimensions, in particular the diameter Dc of the probe body 20C and thus the overall dimensions of the probe, so as to ensure the possibility to use such a contact probe 20 even for reduced-pitch applications.

The present invention also relates to a probe head 30 comprising a plurality of contact probes 20, made as above indicated, each having at least one contact end, in particular a contact tip 20A, adapted to abut onto a contact pad 40A of an integrated device under test 40. Such a probe head may be used for applications with high-frequency and high-current signals, each contact probe 20 having an overall length LS less than 5000-7000 μm and being provided with a conductive insert 25 adapted to the current capacity necessary for the specified application.

Figure 11:
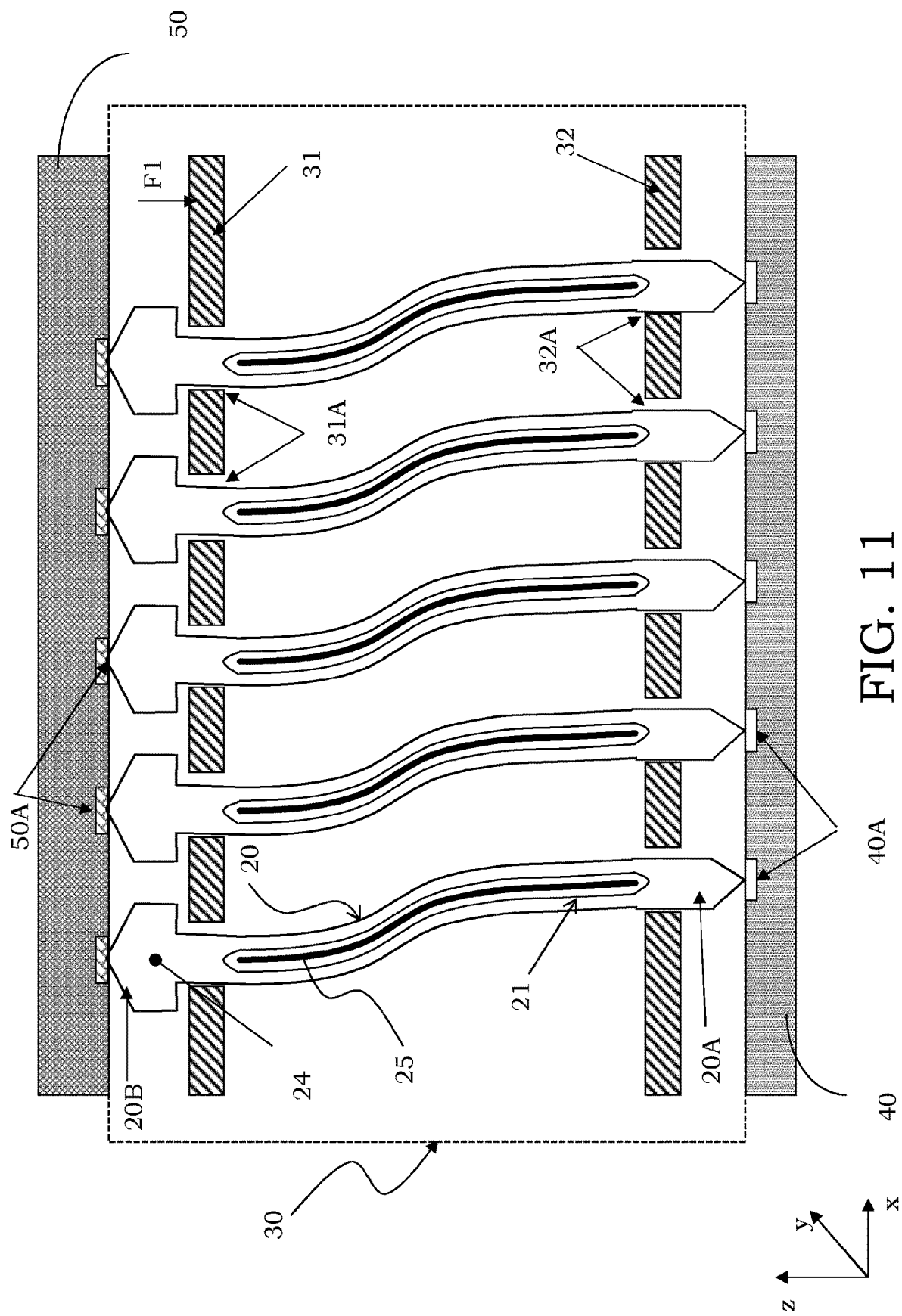
FIG. 11 schematically shows an embodiment of a probe head including contact probes made according to an embodiment of the invention.

As schematically illustrated in FIG. 11, the probe head 30 may comprise at least one plate-shaped support or guide, preferably a pair of guides 31, 32 provided with a plurality of guide holes 31A, 32A adapted to slidably house the contact probes 20, in particular according to the embodiment of FIG. 2A only by way of example, which have a second contact end, in particular a contact head 20B, adapted to abut onto a contact pad 50A of a PCB 50 in connection with a testing apparatus (not illustrated). Suitably, the guide holes are dimensioned so as to have a transversal diameter smaller than the diameter Db of the contact head 20B, so that the enlarged portion 24 may abut onto a face F1 of a guide 31 and ensure the correct holding of the corresponding contact probe 20. The term "diameter" anyway indicates a maximum transversal dimension, even in the case of non-circular holes.

Alternatively, the contact probes 20 may be welded to a support of the probe head 30, in particular at the end thereof which is positioned at the testing apparatus, the respective contact tips 20A being anyway adapted to abut onto pads 40A of the device under test 40.

It is emphasized that it is also possible to make a probe head so as to comprise contact probes provided with at least one conductive insert and contact probes which do not comprise such an insert, alternated based on the specific application needs, the contact probes with conductive insert being positioned so as to carry possible high-current signals.

In conclusion, the contact probe made according to embodiments of the present invention allows solving the problem of carrying high-current signals, while ensuring a reduced mechanical resistance of the probe as a whole and thus a limited force on the pads, so as to reduce, if not eliminate, the risks of breaking the pads or even the probes, in particular in the case of short probes, i.e. having a length less than 5000-7000 μm. Suitably, the presence of the conductive insert made of the low-electrical resistivity material allows obtaining contact probes having electrical resistance values lower with respect to the probes currently used in the field. Furthermore, being said conductive insert arranged in the bending plane of the contact probe which comprises it, the same is able to improve the mechanical strength of the probe as a whole.

In particular said contact probes have proved to have particularly performing operating properties suitable for their use in high-frequency applications, in particular frequencies greater than 1000 MHz, thanks to their reduced dimensions which are less than 5000-7000 μm, the presence of the slot in the body of the contact probes allowing to decrease the rigidity thereof and dramatically reducing the possibilities of breaking the probes, meanwhile ensuring a suitable reduction of the pressure exerted by the corresponding contact tips, so as to avoid possible breaking the contact pads of the devices under test and breaking the probes themselves.

Furthermore, the use of conductive inserts with dimensions suitable for being arranged inside the contact probe maintains its overall dimensions practically unaltered and allows the use thereof for fine-pitch applications.

More particularly, advantageously according to the present invention, the combined use of the bearing arms and of the conductive inserts allows making short or ultrashort probes that minimize the electrical resistance and maximize the current capacity over an extended temperature range, more particularly from −55° C. up to +150° C. and above.

Tests carried out by the applicant itself have shown that it is possible to obtain contact probes which, abutting onto the respective pads of a device under test and of a space transformer, apply a maximum force of 2.5-3 g, capable of avoiding damage to these pads or to any contact bumps and to favor a correct management of the loads even in products with a high number of probes (>30K), while guaranteeing a minimum force of 1.0-1.5 g, so as to ensure a good electrical contact between probes and contact pads/bumps.

Suitably, the contact probe according to embodiments of the present invention represents a solution with geometric scalability, the combined use of the bearing arms and conductive inserts ensuring a correct fatigue resistance even in the extreme conditions of 1M of contacts with maximum vertical displacement imposed (100 μm OD [Over Drive]) and a reduced hot relaxation (less than 10% change in force after 100 h at maximum displacement imposed, in addition to a control of the plastic deformation of the contact probe as a whole).

Furthermore, the presence of the enlarged portion at the contact head ends ensures the correct holding of the contact probes inside a probe head, in particular even when the probe head is not abutting onto a device under test or during cleaning operations.

Finally, the advantage linked to the fact that the contact probes are made in a simple way and with low costs should not be overlooked, as they can be made using conventional photolithographic technologies, or using MEMS technologies (Micro Electro-Mechanical System), or even with laser technology starting from a multilayer material that includes the structurally stable material which the contact probes are made of and the low-electrical resistivity material which the conductive inserts are made of, in particular a multilayer material with layers of structurally stable material and low-electrical resistivity material grown parallel to the longitudinal development direction of the probe and its arms.

The considerations made are also valid for different embodiments not herein specified but in any case object of the present invention, such as, for instance, a probe head having a single guide and probes blocked at the corresponding contact heads. Moreover, the measures adopted in relation to an embodiment can also be used for other embodiments and can be freely combined with each other even in a number greater than two.

Obviously, a person skilled in the art, in order to satisfy contingent and specific requirements, may make to the contact probe above described numerous modifications and variations, all included in the scope of protection of the invention as defined by the following claims.

For instance, it is possible to make the contact probe without any enlarged portion or to provide it with suitable stoppers made projecting from the probe body so as to ensure the correct positioning and holding of the probes inside a probe head, possibly in combination with the enlarged portion of the contact head ends.

The invention claimed is:

1. A contact probe comprising:
   a first end portion and a second end portion;
   a probe body extended along a longitudinal development direction between the first end portion and the second end portion, the probe body comprising a pair of arms separated by a slot and extending according to the longitudinal development direction; and
   a conductive insert extended along the longitudinal development direction, in a bending plane of the contact probe;
   wherein the conductive insert is made of a first material and the contact probe is made of a second material,
   wherein the first material has a lower electrical resistivity than an electrical resistivity of the second material,
   wherein the conductive insert is a power transmission element of the contact probe,
   wherein the arms are structural support elements of the contact probe during a deformation of the probe body, and
   wherein the conductive insert is placed inside one of the arms and has a transversal dimension, orthogonal to the longitudinal development direction, being smaller than corresponding transversal dimensions of the arms.

2. The contact probe of claim 1, wherein the first material has an electrical resistivity lower than 30 μΩ*cm.

3. The contact probe of claim 1, wherein the first material is a low-electrical resistivity conductive or semiconductor material selected from gold (Au), copper (Cu), silver (Ag), aluminum (Al), platinum (Pt) and alloys thereof and the second material is a structurally stable conductive material selected from nickel, tungsten, cobalt, palladium or alloys thereof.

4. The conductive probe of claim 3, wherein the alloys are selected from the group consisting of the nickel-manganese, nickel-cobalt, nickel-palladium, nickel-tungsten, palladium-cobalt alloys, palladium-based ternary and quaternary alloys.

5. The contact probe of claim 1, wherein the first material is silver, and the second material is palladium-cobalt.

6. The contact probe of claim 1, wherein the conductive insert has a length equal to a length of the slot.

7. The contact probe of claim 1, wherein the conductive insert further comprises additional conductive portions made of the first material and completely embedded within the second material of the contact probe.

8. The contact probe of claim 7, wherein the additional conductive portions are within the first second end portion and second end portion.

9. The contact probe of claim 1, wherein the conductive insert extends along the entire contact probe and emerges from the second material at a first contact area and a second contact area of the first end portion and second end portion, respectively.

10. The contact probe of claim 1, further comprising conductive insert longitudinally extended in each of the arms.

11. The contact probe of claim 1, wherein the conductive insert has a length along the longitudinal development direction smaller than a length of the contact probe.

12. The contact probe of claim 1, wherein the conductive insert has a length along the longitudinal development direction sufficient to emerge from the second material of the contact probe.

13. A probe head for testing an integrated device under test, the integrated device under test having a plurality of contact pads, and the probe head comprising a first plurality of contact probes, each of the contact probe comprising:
   a first end portion and a second end portion, at least one of said end portions being adapted to abut onto a contact pad of the integrated device under test;
   a probe body extended along a longitudinal development direction between the first end portion and the second end portion, the probe body comprising a pair of arms separated by a slot and extending according to the longitudinal development direction; and
   a conductive insert extended along the longitudinal development direction, in a bending plane of the contact probe;
   wherein the conductive insert is made of a first material and the contact probe is made of a second material;
   wherein the first material has a lower electrical resistivity than an electrical resistivity of the second material,
   wherein the conductive insert is a power transmission element of the contact probe,
   wherein the arms are structural support elements of the contact probe during a deformation of the probe body, and
   wherein the conductive insert is placed inside one of the arms and has a transversal dimension, orthogonal to the longitudinal development direction, being smaller than corresponding transversal dimensions of the arms.

14. The probe head of claim 13, further comprising a second plurality of contact probes having probe bodies provided with arms and missing at least one conductive insert.

* * * * *